(12) United States Patent
Eidson

(10) Patent No.: US 7,610,175 B2
(45) Date of Patent: Oct. 27, 2009

(54) TIMESTAMPING SIGNAL MONITOR DEVICE

(75) Inventor: John C. Eidson, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 625 days.

(21) Appl. No.: 11/348,575

(22) Filed: Feb. 6, 2006

(65) Prior Publication Data

US 2007/0183459 A1   Aug. 9, 2007

(51) Int. Cl.
*G06F 17/40* (2006.01)
*G06F 19/00* (2006.01)

(52) U.S. Cl. ............... 702/187; 324/76.11; 368/89; 377/1; 377/13; 377/19; 702/57; 702/66; 702/69; 702/79; 702/89; 713/500; 713/502

(58) Field of Classification Search ............... 324/76.54, 324/76.11, 76.39, 76.52, 76.77; 368/89, 368/107, 46; 377/1, 6, 13, 16, 19, 20; 702/109, 702/125, 1, 57, 66, 69, 75, 78, 79, 85, 89, 702/108, 124, 127, 176, 178, 182, 186, 187, 702/188; 709/223, 224; 713/400, 500, 502, 713/503

See application file for complete search history.

(56) References Cited

U.S. PATENT DOCUMENTS

| 2,831,162 | A | * | 4/1958 | Gross | 368/118 |
| 4,090,035 | A | * | 5/1978 | Popkin | 370/217 |
| 4,350,980 | A | * | 9/1982 | Ward | 340/870.02 |
| 5,293,374 | A | * | 3/1994 | Eidson | 702/117 |
| 5,313,622 | A | * | 5/1994 | Truchard et al. | 714/814 |
| 5,519,625 | A | * | 5/1996 | Chu | 702/176 |
| 6,512,990 | B1 | | 1/2003 | Woods et al. | |
| 6,741,952 | B2 | * | 5/2004 | Eidson | 702/187 |
| 7,058,020 | B2 | * | 6/2006 | Tavana et al. | 370/252 |
| 7,492,785 | B2 | * | 2/2009 | Seligman et al. | 370/449 |
| 2003/0158706 | A1 | * | 8/2003 | Eidson | 702/187 |
| 2005/0094661 | A1 | * | 5/2005 | Seligman et al. | 370/449 |

* cited by examiner

*Primary Examiner*—Edward R Cosimano

(57) ABSTRACT

A signal monitor device that detects a signal propagating on a signal line and that generates a timestamp when the signal is detected. The timestamp may be used in a variety of applications including measuring the propagation delays on signal lines and determining the timing in a system.

20 Claims, 4 Drawing Sheets

TIMESTAMPING SIGNAL MONITOR DEVICE

BACKGROUND

Signal lines may be used to carry a wide variety of electrical signals in a wide variety of systems. Examples of signal lines include wires, coaxial cables, twisted pairs, optical fibers, etc. Signal lines may carry analog signals, digital signals, encoded signals, data packets, etc.

It may be desirable in a variety of circumstances to determine a time when an electrical signal propagating on a signal line reaches a particular point along the signal line. For example, the times when an electrical signal reaches different points along a signal line may be used to determine a propagation delay of the signal line. In another example, the times when different electrical signals in a system reach different points along different signal lines in the system may be used to determine the overall timing of the system.

Oscilloscopes, logic analyzers, and similar instruments may be used to detect the presence of an electrical signal at a particular point along a signal line. Unfortunately, oscilloscopes, logic analyzers, and similar instruments are relatively complex and expensive and may not be practical to use in some environments and physical locations.

SUMMARY OF THE INVENTION

A signal monitor device is disclosed that detects a signal propagating on a signal line and that generates a timestamp when the signal is detected. The timestamp may be used in a variety of applications including measuring the propagation delays on signal lines and determining the timing in a system.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
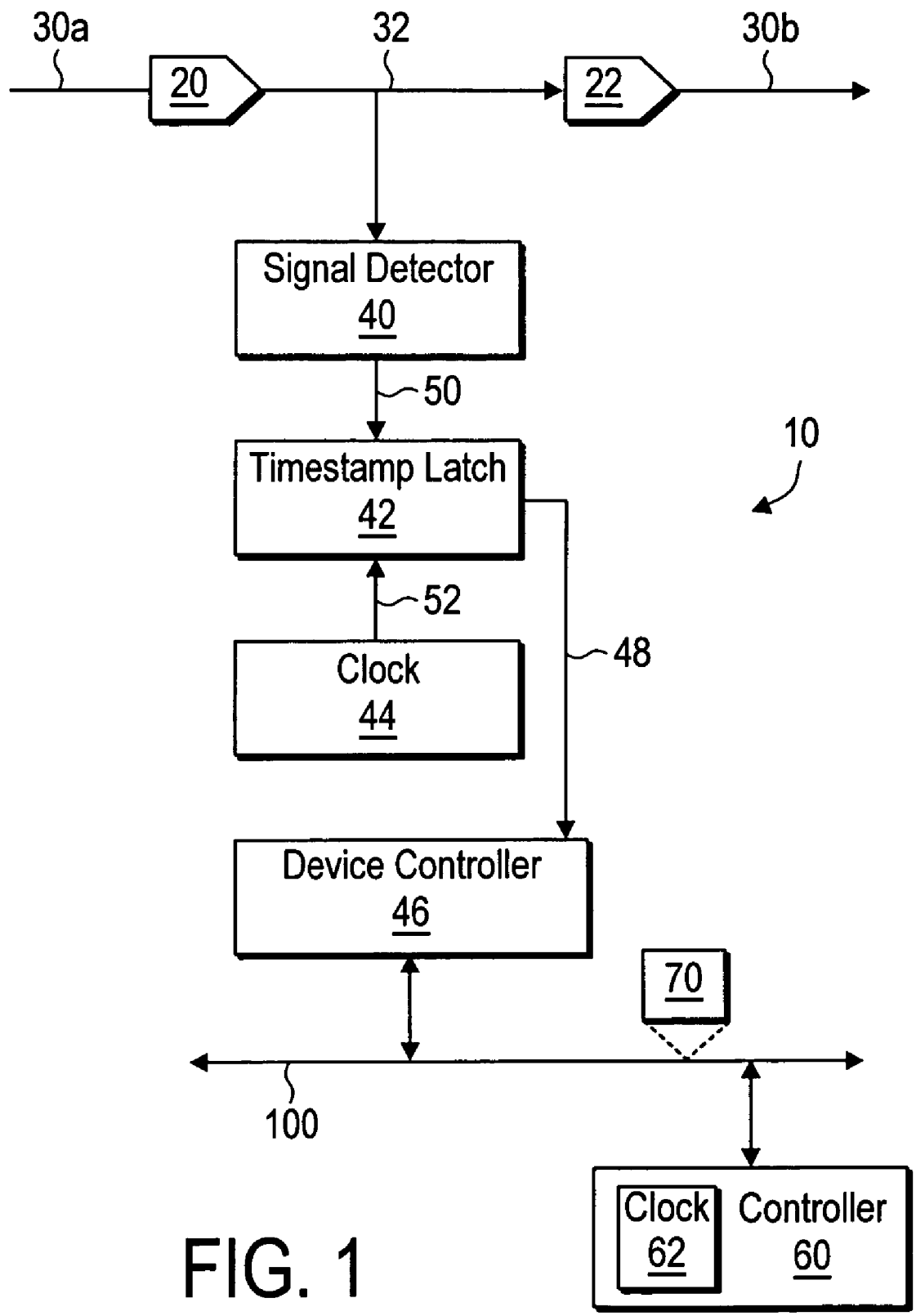
FIG. 1 shows one embodiment of a signal monitor device according to the present teachings.

FIG. 1 shows one embodiment of a signal monitor device 10 according to the present teachings. The signal monitor device 10 includes a signal detector 40, a timestamp latch 42, a clock 44, and a device controller 46. In one embodiment, the clock 44 maintains a time-of-day. The device controller 46 includes circuitry that is adapted from communication via a network 100. The network 100 may be a wire-based network or a wireless network. The network 100 may be a local area network, e.g. Ethernet.

The signal monitor device 10 includes a pair of connectors 20 and 22 that enable the signal monitor device 10 to be inserted in the path of a signal line in between portions 30a and 30b of the signal line. The connectors 20 and 22 are adapted to the physical implementation of the signal line. For example, if the signal line is a coaxial cable then the connectors 20 and 22 are adapted for coaxial cables, e.g. BNC connections. In other embodiments, the connectors 20 and 22 may be adapted for connections to wires, twisted pairs, optical fibers, transmission lines of a local area network, e.g. Ethernet, to name a few examples.

The signal monitor device 10 includes a signal line 32 that is a short length of the same signal medium of the signal line so that a signal entering the connector 20 propagates along the signal line 32 and out the connector 22. For example, if the signal line is a coaxial cable then the signal line 32 is a short length of coaxial cable.

The signal detector 40 senses the electrical states of the signal line 32 and detects a signal on the signal line 32. In one embodiment, the signal detector 40 presents a relatively high impedance to the signal line 32.

In one embodiment, the signal detector 40 includes circuitry for detecting an edge, e.g. rising edge or falling edge, of a TTL signal on the signal line 32. The signal detected by the signal detector 40 may be a predetermined pattern in a TTL signal, e.g. an encoded information signal. In another embodiment, the signal detector 40 includes circuitry for detecting an edge or a predetermined pattern of a low voltage differential signal (LDVS).

In another embodiment, the signal detector 40 includes circuitry for detecting packets, e.g. Ethernet packets. The signal detector 40 may detect a packet header or other pattern on the signal line 32. The signal detector 40 may include circuitry for decoding packets so that particular types of packets may be detected.

When the signal detector 40 detects a signal on the signal line 32 it generates a signal 50 that causes the timestamp latch 42 to latch a time 52 from the clock 44. The latched time in the timestamp latch 42 is provided to the device controller 46 as a timestamp 48.

The device controller 46 in some embodiments corrects the timestamp 48. For example, the device controller 46 may correct the timestamp 48 by subtracting the propagation delay of a signal from the connector 20 to the signal detector 40 and the delay in latching the time 52 from the clock 44 in response to the signal 50.

The device controller 46 transfers the timestamp 48 via the network 100 in a message 70. Other devices on the network 100 may receive the message 70 and use the timestamp 48 carried in the message 70 as appropriate. For example, a remote device on the network 100 may use the timestamp 48 carried in the message 70 in a determination of a propagation delay of the signal line or in evaluating the timing of a system.

For example, a controller 60 on the network 100 receives the message 70 via the network 100 and extracts the timestamp 48 carried in the message 70. The controller 60 includes a clock 62 that provides a time-base for evaluating the timestamp 48. For example, if the timestamp 48 is 10:01:22 AM and a local time in the clock 62 is 10:01:23 AM then it indicates that a signal was detected by the signal monitor 10 one second earlier. In many applications the resolutions of the clocks 44 and 62 are much higher than the one second resolution in this example.

The signal monitor 10 and the controller 60 in one embodiment include mechanism for engaging in a time synchronization protocol to synchronize the times held in the clocks 44 and 62. One example of a protocol for synchronizing the clocks 44 and 62 is the IEEE 1588 time synchronization protocol which includes the signal monitor 10 and the controller 60 exchanging timing messages via the network 100.

In an alternative to the connectors 20 and 22, the signal monitor device 10 may include a sensor probe for sensing a signal on the signal line without a physical connection to the signal line. For example, a sensor probe may detect electromagnetic energy emanating from the signal line or may detect stray light emitted from the signal line.

Figure 2:
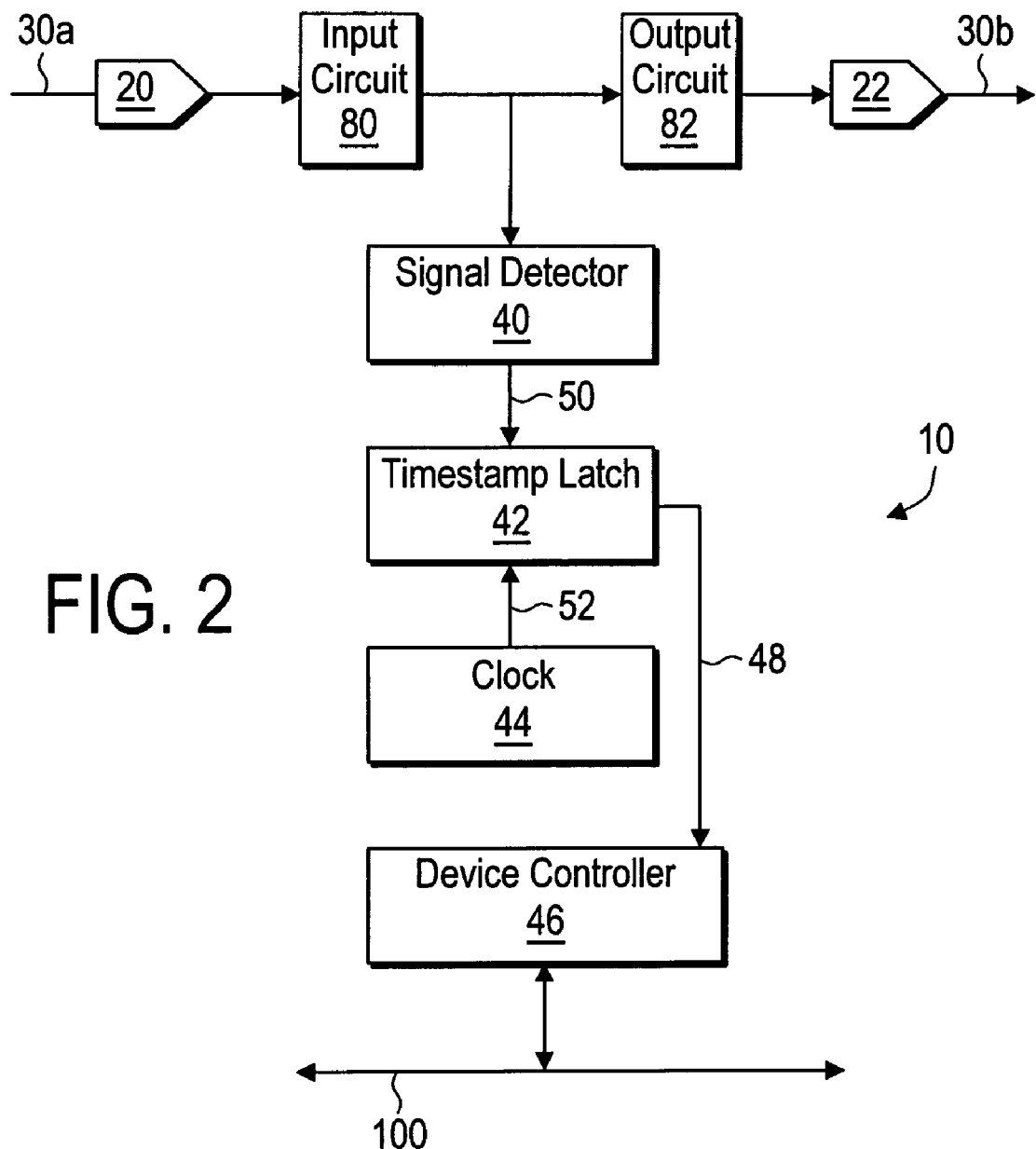
FIG. 2 shows an embodiment of a signal monitor device that provides active sensing of a signal on a signal line.

FIG. 2 shows an embodiment of the signal monitor device 10 that provides active sensing of a signal on the signal line. The signal monitor device 10 in this embodiment includes an input circuit 80 and an output circuit 82 that buffer a signal received the signal line. The input circuit 80 and the output circuit 82 also enable a determination of a direction of a signal on the signal line.

The input circuit 80 and the output circuit 82 are adapted to the physical implementation of the signal line. In some embodiments, the input circuit 80 includes a physical interface circuit (PHY) for decoding a signal received via the signal line and the output circuit 82 includes a PHY for encoding an output of the signal back onto the signal line. For example, if the signal line is an Ethernet line then the input circuit 80 and the output circuit 82 include circuitry for a media independent interface (MII). If the signal line is LDVS then the input circuit 80 and the output circuit 82 include circuitry for isolating the signal detector 40 from LDVS. In other embodiments, the input circuit 80 and the output circuit 82 do not decode and encode but instead buffer a signal by matching the impedances of the signal line.

Figure 3:
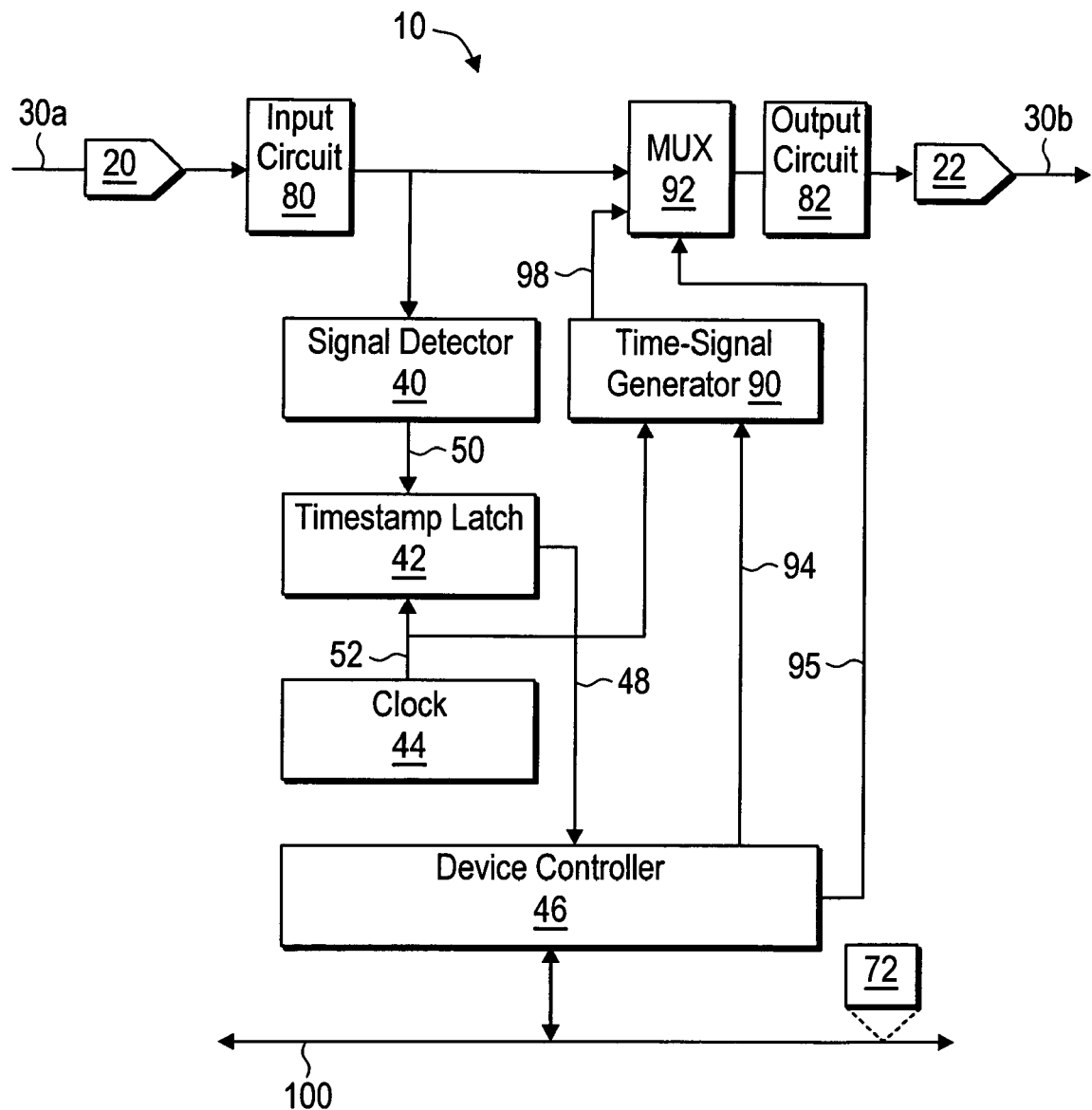
FIG. 3 shows an embodiment of a signal monitor device that includes circuitry for inserting a timed signal onto a signal line.

FIG. 3 shows an embodiment of the signal monitor device 10 that includes circuitry for inserting a timed signal onto the signal line. The signal monitor device 10 in this embodiment includes a time signal generator 90 and a multiplexor (MUX) 92.

The device controller 46 programs a trigger time 94 into the time signal generator 90. The trigger time 94 may be received in a message 72 via the network 100, e.g. from the controller 60. The time signal generator 90 generates a timed signal 98 when the local time 52 from the clock 44 matches the trigger time 94. The MUX 92 provides the timed signal 98 to the output circuit 82 which applies it to the signal line. The MUX is controlled by the device controller 46 via a signal 95 so that the device controller 46 may select either a signal received via the input circuit 80 or the timed signal 98.

Figure 4:
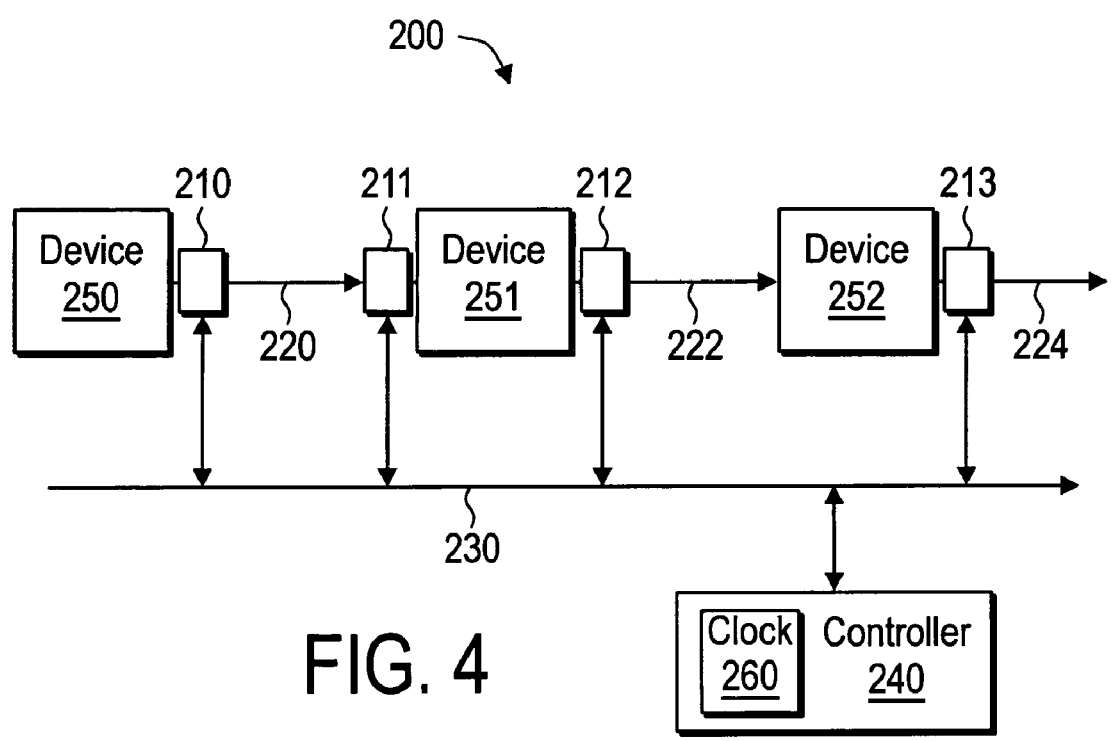
FIG. 4 shows a system that employs a set of signal monitor devices according to the present teachings.

FIG. 4 shows a system 200 that employs a set of signal monitor devices 210-213 according to the present teachings. The system 200 includes a set of devices 250-252 that are interconnected via a set of signal lines 220-224.

The signal monitor devices 210-213 enable a controller 240 to gather a view of system timing in the system 200. For example, the signal monitor device 210 generates a timestamp Ta when the device 250 puts a signal onto the signal line 220, the signal monitor device 211 generates a timestamp Tb when the signal generated by the device 250 reaches an input to the device 251. The signal monitor device 212 generates a timestamp Tc when the device 251 puts a signal onto the signal line 222 and the signal monitor device 213 generates a timestamp Td when the device 252 puts a signal onto the signal line 224.

The controller 240 obtains the timestamps Ta-Td from the signal monitor devices 210-213 via a network 230. The controller 240 includes a clock 260 that provides a time base for evaluating the timestamps Ta-Td. For example, the timestamps Ta and Tc and Td may correspond to events in the system 200. The controller 240 may use the timestamps Ta-Td to adjust the timing in the system 200, e.g. by reprogramming one or more of the devices 250-252, adjusting cable lengths, etc., to a achieve an overall system timing goal.

In one embodiment, the clock 260 and the respective clocks in the signal monitor devices 210-213 synchronize their time-of-day using the IEEE 1588 time synchronization protocol by exchanging timing messages via the network 230. Other time synchronization protocols may be used, e.g. NTP.

The signal monitor devices 210 and 211 are also used to measure a propagation delay of the signal line 220. For example, the signal monitor device 210 generates a first timestamp when the device 250 puts a signal on the signal line 220 and the signal monitor device 211 generates a second timestamp when that signal reaches the device 251. The controller 240 obtains the first and second timestamps from the signal monitor devices 210 and 211 via the network 230 and determines the propagation delay of the signal line 220 in response to the first and second timestamps.

The system 200 is provided as a simple example to illustrate a system that may benefit from the use of a signal monitor device according to the present teachings. A system that employs signal monitoring devices may be relatively complex and/or widely dispersed and may include locations or environments in which instruments such as oscilloscopes and logic analyzers are difficult if not impossible to use. One example of a system that may benefit from a signal monitoring device according to the present teachings is an automatic test equipment (ATE) system having a unit under test (UUT) and a set of instruments that are interconnected via signal lines, e.g. trigger lines. Signal monitoring devices according to the present teachings may be used to measure propagation delays on the trigger lines of an ATE system to determine overall timing of trigger signal distribution throughout an ATE system.

The foregoing detailed description of the present invention is provided for the purposes of illustration and is not intended to be exhaustive or to limit the invention to the accurate embodiment disclosed. Accordingly, the scope of the present invention is defined by the appended claims.

What is claimed is:

1. A signal monitor device, comprising:
 a signal detector that detects a signal propagating on a signal line and that generates a timestamp when the signal is detected; and
 a device controller that corrects the timestamp by subtracting delays introduced by the signal monitor device.

2. The signal monitor device of claim 1, wherein the timestamp is derived from a clock in the signal monitor device that is synchronized to a system time.

3. The signal monitor device of claim 1, comprising a pair of connectors that enable the signal monitor device to be inserted into the signal line.

4. The signal monitor device of claim 1, wherein the signal detector presents a high impedance to the signal line.

5. The signal monitor device of claim 1, comprising circuitry that injects a timed signal onto the signal line.

6. The signal monitor device of claim 1, wherein the device controller transfers a message carrying the timestamp over a network.

7. The signal monitor device of claim 1, further comprising:
 an input circuit that decodes a signal received via the signal line for detection by the signal detector; and
 an output circuit that encodes the decoded signal and outputs the signal back onto the signal line.

8. A method for signal monitoring, comprising:
 detecting a signal propagating on a signal line;
 generating a timestamp when the signal is detected; and
 correcting the timestamp by subtracting delays introduced by the signal monitoring.

9. The method of claim 8, further comprising determining a propagation delay of the signal on the signal line in response to the timestamp.

10. The method of claim 8, further comprising determining a time of an event in a system in response to the timestamp.

11. The method of claim 8, wherein generating a timestamp includes obtaining the timestamp from a clock that is synchronized to a system time.

12. The method of claim 8, wherein detecting a signal comprises physically connecting to the signal line.

13. The method of claim 8, wherein detecting a signal comprises sensing electromagnetic energy emitted from the signal line.

14. The method of claim 8, wherein detecting a signal comprises sensing light emitted from the signal line.

15. The method of claim 8, further comprising injecting a timed signal onto the signal line.

16. A system, comprising:
a set of two or more signal monitor devices that generate a set of timestamps in response to a set of signals propagating on a set of signal lines; and
a device that obtains the timestamps from the signal monitor devices via a network, the device having a clock that provides a time base for evaluating the timestamps.

17. The system of claim 16, wherein the device determines a propagation delay of the signal lines in response to the timestamps.

18. The system of claim 16, wherein the device determines a timing of the signal in response to the timestamps.

19. The system of claim 16, wherein each device includes a local clock such that the local clocks are synchronized to the clock in the device.

20. The system of claim 16, wherein the signal monitor devices inject a set of timed signals onto the corresponding signal lines in response to a message from the device.

* * * * *